United States Patent [19]
Arima et al.

[11] Patent Number: 5,101,250
[45] Date of Patent: Mar. 31, 1992

[54] ELECTRICALLY PROGRAMMABLE NON-VOLATILE MEMORY DEVICE AND MANUFACTURING METHOD THEREOF

[75] Inventors: Hideaki Arima; Yoshinori Okumura; Hideki Genjo; Ikuo Ogoh; Kohjiroh Yuzuriha; Yuichi Nakashima, all of Hyogo, Japan

[73] Assignee: Mitsubishi Denki Kabushiki Kaisha, Tokyo, Japan

[21] Appl. No.: 630,439

[22] Filed: Dec. 20, 1990

Related U.S. Application Data

[63] Continuation of Ser. No. 359,810, Jun. 1, 1989, abandoned.

[30] Foreign Application Priority Data

Jun. 28, 1988 [JP] Japan ............................... 63-161813

[51] Int. Cl.$^5$ .................... H01L 29/68; H01L 27/10; H01L 29/34
[52] U.S. Cl. ............................... 357/23.5; 357/23.24; 357/45; 357/54; 365/185
[58] Field of Search .................... 357/23.5, 23.14, 45, 357/54; 365/185

[56] References Cited

U.S. PATENT DOCUMENTS

4,513,397 4/1985 Ipri et al. ........................... 357/23.5
4,907,197 3/1990 Uchida ............................... 357/23.5

FOREIGN PATENT DOCUMENTS

52-63686 5/1977 Japan ............................... 357/23.5
57-76878 5/1982 Japan ............................... 357/23.5
58-98978 6/1983 Japan ............................... 357/23.5
WO83/03167 3/1983 PCT Int'l Appl. .

OTHER PUBLICATIONS

G. Samachisa et al., "A 128K Flash EEPROM Using Double-Polysilicon Technology" IEEE, *J. of Solid-State Circuits*, vol. SC-22, No. 5 (Oct. 1987) pp. 676-683.
Y. Mitsutani and K. Makita, "A New EPROM Cell with a Side-Wall Floating Gate for High-Density and High-Performance Device", (Dec. 1985), pp. 635-638.
A. Wu et al., "A Novel High-Speed, 5-Volt Programming EPROM Structure with Source-Side Injection", IEDM 86 (Dec. 1986), pp. 584-587.

*Primary Examiner*—J. Carroll
*Attorney, Agent, or Firm*—Lowe, Price, Leblanc & Becker

[57] ABSTRACT

A 1-transistor type flash EEPROM is disclosed. The memory cell in the EEPROM includes a control gate formed on a silicon substrate with an insulating layer disposed between them, and a floating gate formed to extend over the upper face and one side face of the control electrode with an insulating layers disposed between them. Drain and source regions are created in the silicon substrate on the opposite sides of the control gate. The area in the silicon substrate under the control gate between the drain and source regions defines a channel region. In the EEPROM, an application of high-level voltage to the control gate and the drain region produces hot electrons in the vicinity of the opposite ends of the drain region which are driven into the floating gate across the insulating layer, causing the floating gate to store data-representing charge. The flash EEPROM has uniform characteristics among memory cells and reduced cell area for improved miniaturization.

13 Claims, 15 Drawing Sheets

▨ : IMPURITY REGION

ELECTRICALLY PROGRAMMABLE NON-VOLATILE MEMORY DEVICE AND MANUFACTURING METHOD THEREOF

This application is a continuation application of application Ser. No. 07/359,810, filed Jun. 1, 1989, abandoned.

BACKGROUND OF THE INVENTION

1. Field of the Invention

This invention relates generally to electrically programmable, non-volatile semiconductor memory devices and manufacturing method thereof, and more particularly to improved flash-type non-volatile memory devices and manufacturing method thereof.

2. Description of the Background Art

An electrically erasable programmable read only memory (hereinafter referred to as an EEPROM) is known in the art as a type of the semiconductor memory device in which the stored program can be electrically altered and erased. In order to have a brief background idea of the invention, reference is first made to FIG. 1 which shows in block diagram an overall arrangement of a typical prior-art EEPROM.

As shown, the EEPROM includes a memory array 50 formed of a plurality of EEPROM cells, a row address buffer 51 for receiving externally applied row address signal and a column address buffer 52 which receives externally applied column address signals. The EEPROM also includes a row decoder 53 and a column decoder 54. The row decoder 53 decodes the address output from the row address buffer 51 and activates a word line coupled to a particular memory cell to be selected in the memory array, while the column decoder 54 decodes the address output from the column address buffer 52 to activate a Y gate 55 to connect a bit line coupled to the particular memory cell to I/O line. A sense amplifier 56 senses via Y gate 55 a data signal stored in the memory cell which has been selected by the row and column decoders. The sensed signal is, after amplified in the sense amplifier 56, fed out through an output buffer 57. Included also in the EEPROM is an input buffer 58 for providing control signals to various circuits associated with the memory array.

In recent years, it has been proposed a new type of an EEPROM where tunneling current through a thin oxide layer on a semiconductor substrate is used to control the flow of charging electrons into or out of a charge storing floating gate provided on the semiconductor substrate. One such EEPROM is disclosed in Japanese Patent Publication No. 41,431/1987.

Referring now to FIGS. 2A and 2B, there is illustrated a conventional 2-transistor type memory cell for an EEPROM. The 2-transistor memory cell includes a floating gate transistor TR1 and a select gate transistor TR2, both formed on the major surface of a semiconductor substrate 1. The floating gate transistor TR1 comprises a drain region 62, a source region 63, a tunneling oxide layer 64, a floating gate 65 and a control gate 66. Of these components parts, the drain region 62 and source region 63 are provided in the major surface of the semiconductor substrate 1. The tunneling oxide layer 64 is a thin oxide layer deposited over a predetermined area of the drain region 62. The floating gate 65 is made of a polysilicon layer formed over the substrate 1 at least partially to overlap or overlie the tunnel oxide layer 64, and separated therefrom by an intervening insulating layer. On the other hand, the control gate 66 is formed to overlie the floating gate 65 and to be separated by an interposed insulating layer. Overlapped control and floating gates 66 and 65 produce a capacitor with the interposed insulating layer serving as a dielectric material. The floating gate 65 and the drain region 62 form another capacitor with the tunnel oxide layer sandwiched by them serving as dielectric material. The floating gate 65 and the semiconductor substrate 1 also form a capacitor at the area other than the area in contact with the tunneling oxide layer 64. As is known in the art, the floating gate 65 is for storing electrical charge. Depending on the potential applied between the control gate 66 and the drain region 62, electrical charge is injected from the drain region 64 through the tunnel oxide layer 64 into the floating gate 65, or the charge is removed out of the floating gate 65 through the tunneling oxide layer 64 to the drain region 62.

The select transistor TR2 comprises a source region 62 (which also serves as the drain region of the floating gate transistor TR1) and a drain region 67 both provided on the major surface of the semiconductor substrate 1, and a gate electrode 68 which serves as a word line. A bit line 69 is connected to the drain region 67 through a contact hole.

The select transistor TR2 turns on or off in response to the signal supplied through the word line 68 thereby to read out the data stored in the floating gate transistor 1 through the bit line 69.

As stated, the memory cell for the conventional EEPROM is made up of two transistors: a select transistor and a floating gate memory transistor. The select transistor is provided for programming in terms of a byte. However, the provision of the additional select transistor is disadvantageous in that is increases the overall area of each memory cell, and thus of the chip area in a high density semiconductor memory device. In order to overcome this problem, a new type of EEPROM called a flash EEPROM which is a one-transistor memory capable of electrically erasing all the data stored therein simultaneously.

In FIG. 3A, there is illustrated an equivalent circuit for one memory cell in the conventional flash EEPROM, and FIG. 3B shows an equivalent circuit of a four-bit memory configuration using the one-transistor memory cell of FIG. 3A. The memory cell comprises a single floating gate transistor. The floating transistor has a control gate 2 to be connected to word lines W1 and W2, and a source region 7 to be coupled to source lines S1 and S2. The floating gate transistor also has a drain region 8 to be linked to bit lines B1 and B2, and a floating gate 3 provided on the side of the control gate 2 adjacent or near the drain region 8. The floating gate 3 is for storing electrical charge. Depending on the voltage applied between the control gate 2 and the drain region 8, electrical charge is injected into the floating gate 3 from the channel region into the substrate 1, or it is removed from the floating gate 3 to the channel region thereby to write data into the floating gate 3 or to erase the data stored in the floating gate 3. In reading out the data stored in the floating gate transistor, the transistor is turned on/off in response to the signal applied by the word lines W1 and W2 to transfer the stored data out onto the bit lines B1 and B2 coupled to the drain region 8. The writing and reading of the data onto the floating gate is performed by applying a desired voltage to the necessary bit lines B1 and B2 and the word lines W1 and W2. For the erasure of the data, an erasing voltage is applied to all the bit lines B1 and B2, removing all the data stored in all the memory cells simultaneously.

Referring to FIGS. 4–7, there is shown a conventional one-transistor type flash EEPROM as disclosed, for example, in IEEE Journal of Solid-State Circuits, Vol. SC-22, No. 5 (1987, pp. 676–683).

As shown, on a semiconductor substrate 1 of monocrystalline silicon such as a p-type silicon substrate, an n-type source regions 7 and n-type drain regions 8 are created spaced apart from one another. Control gates 2 and floating gates 3 are provide so that channel regions are formed between the control gate 2 and the floating gate 3. The control gate 2 is formed on the substrate 1 and is separated therefrom by a thick gate oxide layer 4. Likewise, the floating gate 3 is formed on the substrate 1 and is separated therefrom by a thin gate oxide layer (FIG. 7). One end portion of the control gate 2 which also serves as the word line overlies the floating gate 3 with a thin insulating layer 6 interposed between them. The other end portion of the control gate 2 extends partially over the thick gate oxide layer 4. The control gate 2 and the underlying floating gate 3 are formed using mask and etched technique so that they overlapped each other over a predetermined plane area. The source region 7 and the drain region 8 placed on the opposite sides of the control and floating gates 2 and 3 are formed in a self-alignment manner by doping impurities into the substrate using the control gate and the floating gate as the masks.

The source region 7 is disposed in the substrate on the side of the control gate 2 which extends over the gate oxide layer 4, while the drain region 8 is positioned on the side of the control gate 2 overlying the floating gate 3. In this manner, the control gate 2 partially overlaps the source region 7 with the thick gate oxide layer 4 disposed between them, and the floating gate 3 partially overlaps the drain region 8 with the thin gate oxide layer 5 placed between them. There is deposited over the control gate 2 an insulating layer 9, through which a contact hole 10 is made to extend to the drain region 8. An aluminum interconnection 11 serving also as the bit line is deposited over the insulating layer 9 and electrically communicated to the drain region 8 via the contact hole 10.

Provided around the memory cell thus formed is a thick field oxide layer 12 for device isolation. The control gate 2 and the floating gate 3 partially overlies the thick field oxide layer 12. Created in the substrate directly below the field oxide layer 12 is a channel stopper region 13 of p-type impurity for the prevention of leakage current.

In the conventional EEPROM structure, the control gate 2 and the floating gate 3 are formed by means of mask and etch technique. Specifically, the one end portion of the control gate 2 overlies the floating gate 3 over a predetermined area with the thin insulating layer 6 disposed between them to provide a prescribed coupling capacitance. The other end portion of the control gate 2 extend adjacent to the source region 7 with the gate oxide layer positioned between them. In short, the control gate 2 must have a portion thereof overlapped the underlying floating gate 3. Also, it has to extend adjacent to the source region. The design requirements inevitably increases the memory cell area, thereby preventing further miniaturization of the memory cell.

As previously stated, the control gate 2 and the floating gate 3 are formed to partially overlap over a predetermined area using mask and etch technique. Any mask misalignment causes a displacement of not only the channel region created in the substrate below the control gate but also the overlapped area between the control gate and the floating gate. Consequently, memory cell in the EEPROM may have channel regions of varying length and different cell currents. A greater channel length in a memory cell increases the cell resistance and reduces the cell current. Moreover, if the coupling capacitance between the control gate and the floating gate differs from memory cell to memory cell, unstable data storage states in the memory cells and differing read-out currents would result.

SUMMARY OF THE INVENTION

Therefore, one object of the invention is to provide a programmable, non-volatile semiconductor memory device having a reduced cell area for improved miniaturization.

Another object of the invention is to provide a programmable, non-volatile semiconductor memory device having uniform characteristics among cells.

Another object of the invention is to provide a programmable, non-volatile semiconductor memory device having characteristics that are relatively insensitive to misalignment between control and floating gate electrodes.

Another object of the invention is to provide an improved programmable, non-volatile semiconductor memory device that is electrically erasable.

Another object of the invention is to provide an improved flash-type non-volatile semiconductor memory device.

A further object of the invention is to provide a method of manufacturing a programmable, non-volatile semiconductor memory device having a reduced cell area for improved miniaturization.

Another object of the invention is to provide a method of manufacturing a programmable, non-volatile semiconductor memory device having uniform characteristics among cells.

Still another object of the invention is to provide a method of manufacturing a programmable, non-volatile semiconductor memory device having characteristics that are relatively insensitive to misalignment between control and floating gate electrodes.

Another object of the invention is to provide a method of manufacturing an improved programmable, non-volatile semiconductor memory device that is electrically erasable.

Another object of the invention is to provide a method of manufacturing an improved flash-type non-volatile semiconductor memory device.

A programmable non-volatile semiconductor memory device in accordance with the invention comprises a semiconductor substrate of a first conductivity type, a source and drain impurity regions of a second conductivity type, a control gate electrode and a floating gate electrode. The semiconductor substrate has a major surface. The source and drain impurity regions are formed spaced apart from each other in the major surface of the semiconductor substrate to form a channel region. The control gate electrode is formed on the channel region through a first insulating layer. The floating gate electrode is formed on the control gate electrode through a second insulating layer. The floating gate electrode includes an upper conductive layer and a side conductive layer. The upper conductive layer is formed on the control gate electrode through the second insulating layer. The side conductive layer is formed on one side of the control gate electrode through the second insulating layer and on the channel region adjacent the drain impurity region through the first insulating layer. The upper and side conductive layers are electrically interconnected.

According to a preferred embodiment of the invention, the thickness of a portion of the first insulating layer between the side conductive layer and the channel region has a thickness sufficient to allow tunneling current to flow therethrough, whereby the device is electrically erasable. The side conductive layer of the floating gate electrode includes a portion having a width that is less than the width of the upper conductive layer. The side conductive portion of the floating gate electrode is bifurcated.

A semiconductor memory device according to one aspect of the invention includes a semiconductor substrate of a first conductivity type having a major surface, and a plurality of memory cells formed spaced apart and separated from one another by an isolation layer deposited on the major surface of the semiconductor substrate. Each memory cell is formed as before and includes first and second impurity regions both of which are second conductivity type, and first and second conductive layers. According to a preferred embodiment of the invention, the second conductive layer comprises an upper conductive layer and a side conductive layer which are electrically connected on the isolation layer.

A semiconductor memory device according to another aspect of the invention includes a semiconductor substrate of the first conductivity type having a major surface, and memory cells in a number of (m×n) arranged in the matrix of m rows and n columns on the major surface of the semiconductor substrate and electrically separated from one another by an isolation layer. Each memory cell is formed as before and comprises first and second impurity regions of the second conductivity type, first and second conductive layers. The semiconductor memory device also includes m word lines corresponding in number to the memory cells arranged in each row of the matrix, n bit lines corresponding in number to the memory cells arranged in each column: and m source lines corresponding in number to the memory cells arranged in each row. The first impurity region is connected to the bit line, while the second impurity region is coupled to the source line. The first conductive layer is connected to the word line. According to a preferred embodiment of the invention, the word line is formed integral with the first conductive layer. The source line may preferably be formed of the impurity region of the second conductivity type including the second impurity region. The word line may preferably be arranged parallel with the source line, and the bit line orthogonally to the word line.

In accordance with a method for manufacturing a semiconductor memory device pursuant to the present invention, first conductive layers are formed spaced apart on a major surface of a substrate of a first conductivity type and separated therefrom by a first insulating layer. Second conductive layers are formed on the first conductive layers and separated therefrom by a second insulating layer. The second conductive layer comprises an upper conductive layer and a side conductive layer. The upper conductive layer is disposed on the first conductive layer and separated therefrom by the second insulating layer. The side conductive layer is provided on one side of the first conductive layer, and it is separated from the first conductive layer by the second insulating layer on one hand, and it overlies the major surface of the semiconductor substrate with the first insulating layer interposed between them on the other. The upper conductive layer and the side conductive layer are electrically connected to each other. Created in the major surface of the semiconductor substrate between the first and second conductive layers are impurity regions of second conductivity type which include first and second impurity regions. The first impurity region is formed in the neighborhood of the first impurity region, while the second impurity region in the vicinity of the other side of the first conductive layer.

In the semiconductor memory device according to the invention, floating gate electrode for storing data-representing charge extends over the upper surface and the side surface of the control gate electrode. Thus, the area of the semiconductor substrate occupied by the floating gate electrode is the very area which the side conductive layer on one side of the control gate electrode occupies. In other words, only the control gate electrode and the side conductive layer are in contact with the major surface of the semiconductor substrate and their contact area are very small. The fact that the upper conductive layer of the floating gate electrode is provided at least on the upper surface of the control gate electrode eliminates the need for the use of high precision mask and etching technique in forming the control and floating gate electrodes. This also effectively can avoid undesirable effects caused by misalignment of the mask. The result is that the possibilities of non-uniform coupling capacitance between the control gate electrode and the upper conductive layer of the floating gate electrode as well as non-uniform channel length of the channel regions created under the control gate electrode and the side conductive layer of the floating gate electrode are substantially reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
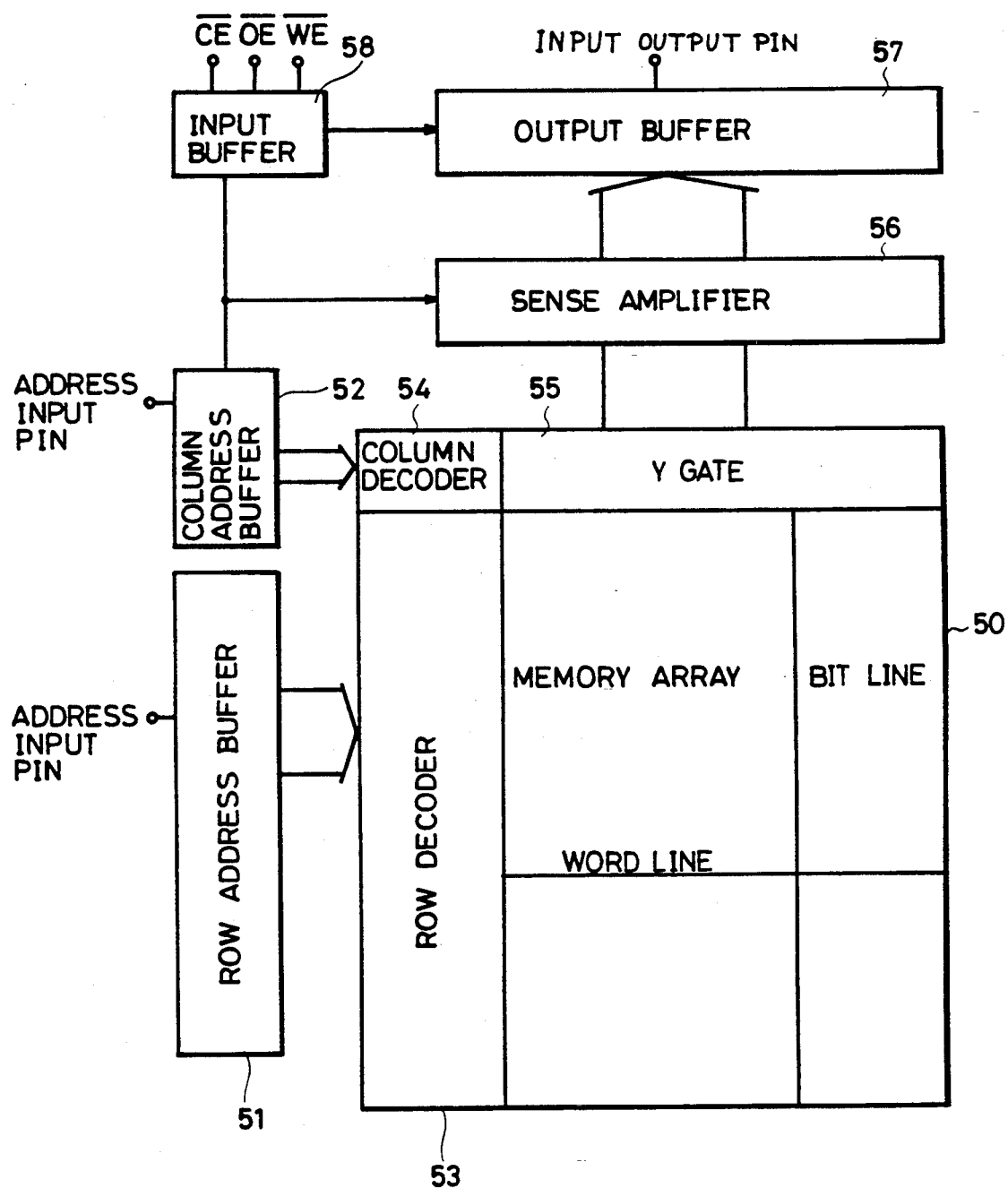
FIG. 1 is a block diagram showing an overall arrangement of a typical prior-art EEPROM.
Figure 2A:
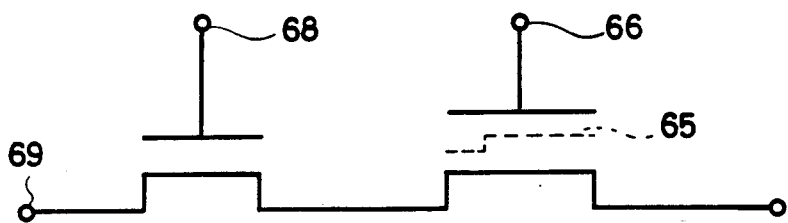
FIG. 2A is an equivalent circuit for a 2-transistor memory cell incorporated in the conventional EEPROM.
Figure 2B:
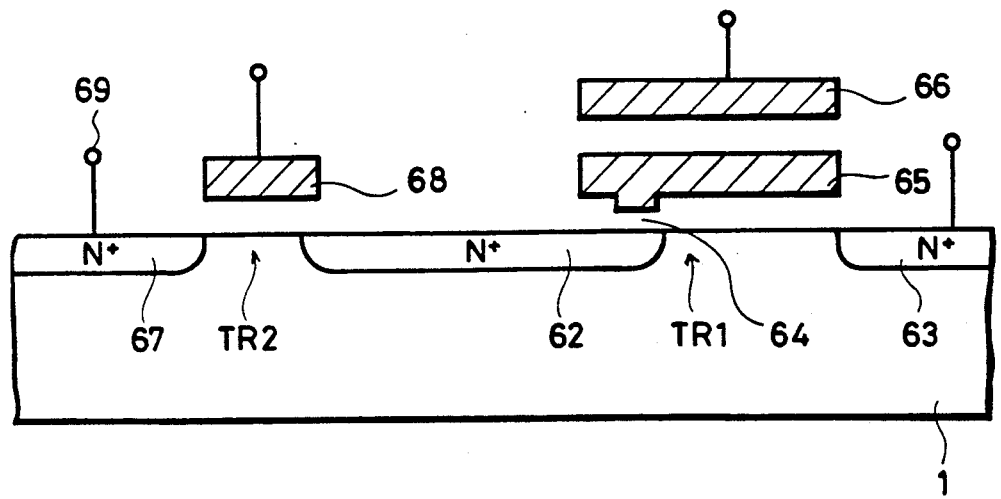
FIG. 2B is a cross-sectional view of the conventional 2-transistor memory cell.
Figure 3A:
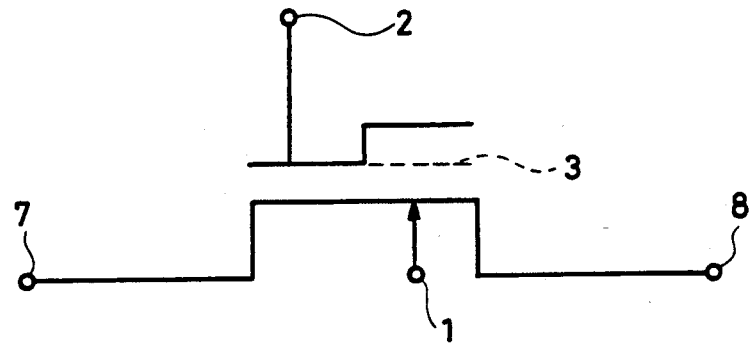
FIG. 3A is an equivalent circuit of a 1-transistor memory cell incorporated in a prior-art flash EEPROM.
Figure 3B:
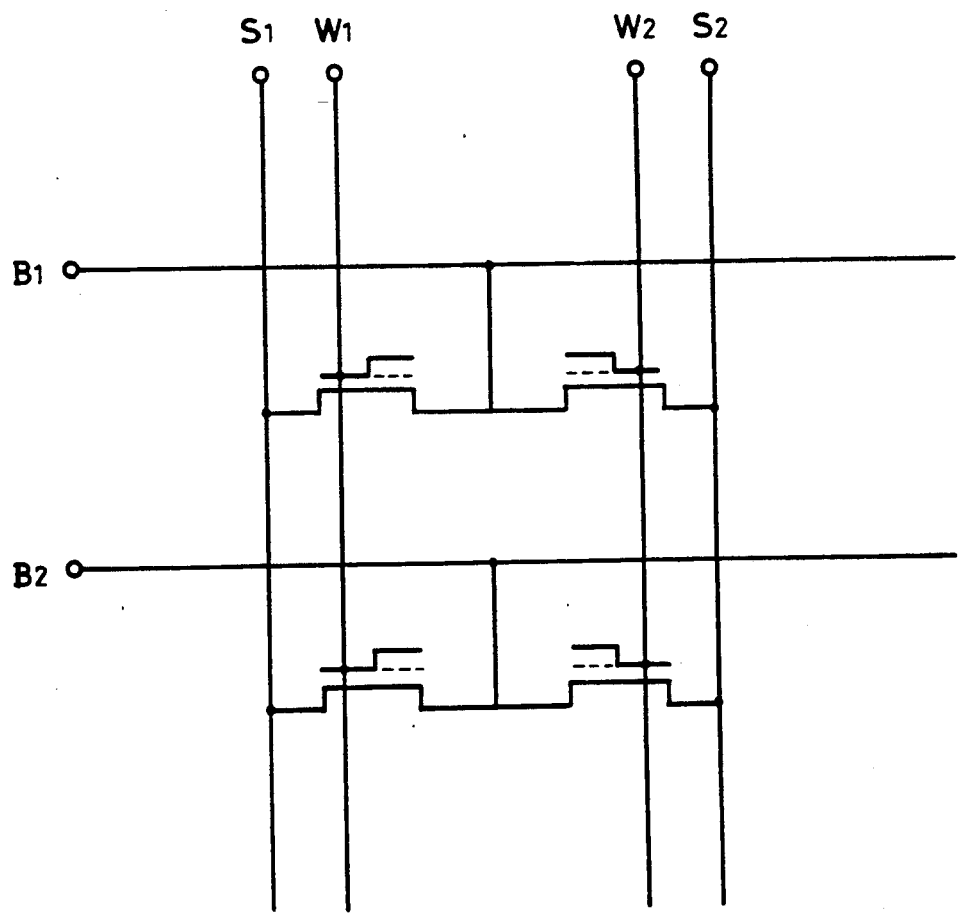
FIG. 3B is a circuit diagram of a 4-bit memory configuration formed by using the memory cell shown in FIG. 3A.
Figure 4:
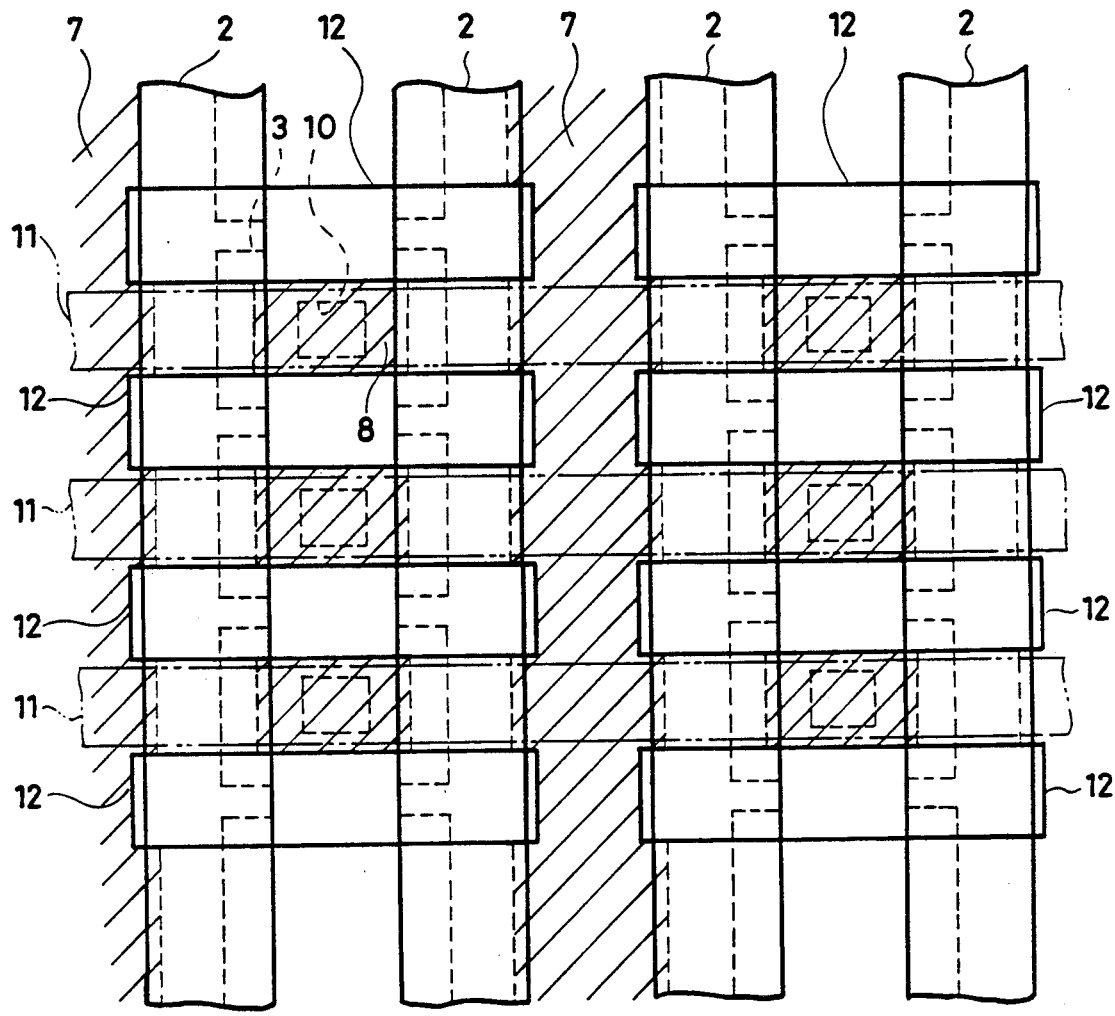
FIG. 4 is a plan view showing a planar configuration of a prior-art flash EEPROM.
Figure 5:
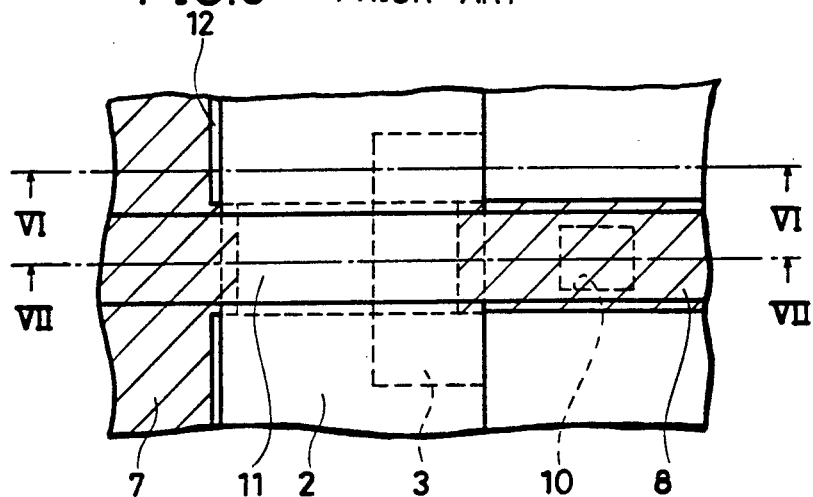
FIG. 5 is a partial plan view of one memory cell incorporated in the prior-art flash EEPROM of FIG. 4.
Figure 6:
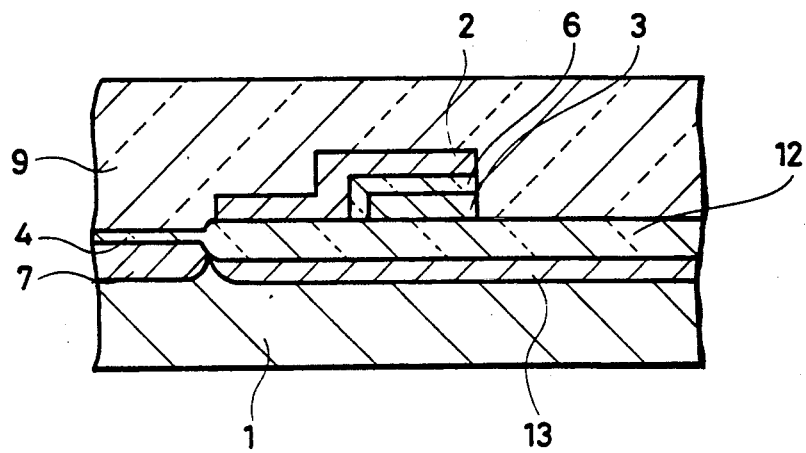
FIG. 6 is a partial cross-sectional view taken along the line VI—VI of FIG. 5.
Figure 7:
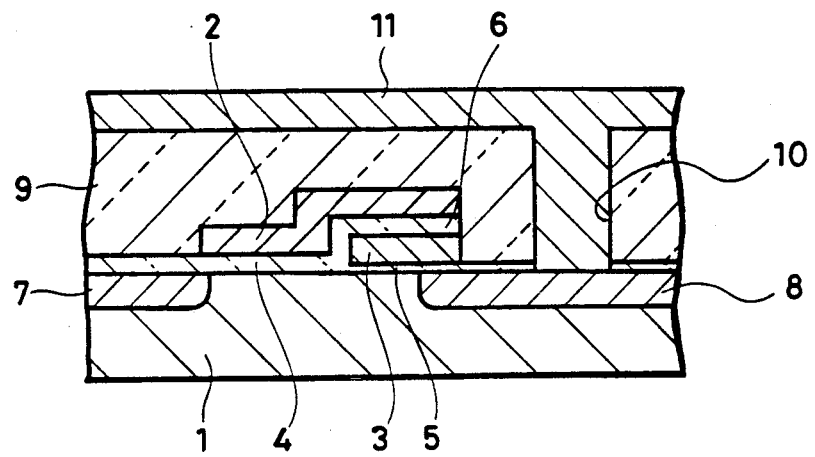
FIG. 7 is a cross-sectional view of the memory cell taken along the line VII—VII of FIG. 5.

Referring first to FIGS. 8A-12, a semiconductor memory device as embodied in a flash EEPROM according to this invention is described. As shown, on the major surface of a p-type semiconductor substrate 1, n-type source regions 23 and n-type drain regions 24 are formed spaced apart from one another as impurity regions. Control gates 29 are provided over the channel regions between the source region 23 and the drain region 24 in the semiconductor substrate, and they are separated from a semiconductor substrate by a first gate oxide layer 17. It should be noted that the control gate 29 also serves as the word line. Provided on the control gate 29 is a first floating gate 28a with a thin insulating layer 19 placed between them. A second floating gate 28b is formed on one side of the control gate 29 with a second gate oxide gate layer 20 disposed between them. In this manner, the second floating gate 28b is positioned adjacent to the drain region 24 while the control gate 29 is disposed adjacent to the source region 23. The first and second floating gate sections 28a and 28b together form floating gate 28. The thin insulating layer 19 lies between the floating gate 28 and the control gate 29. The arrangement of the floating gate 28 and the control gate 29 can be seen in FIGS. 10B, 10D and 10F.

Figure 10A:
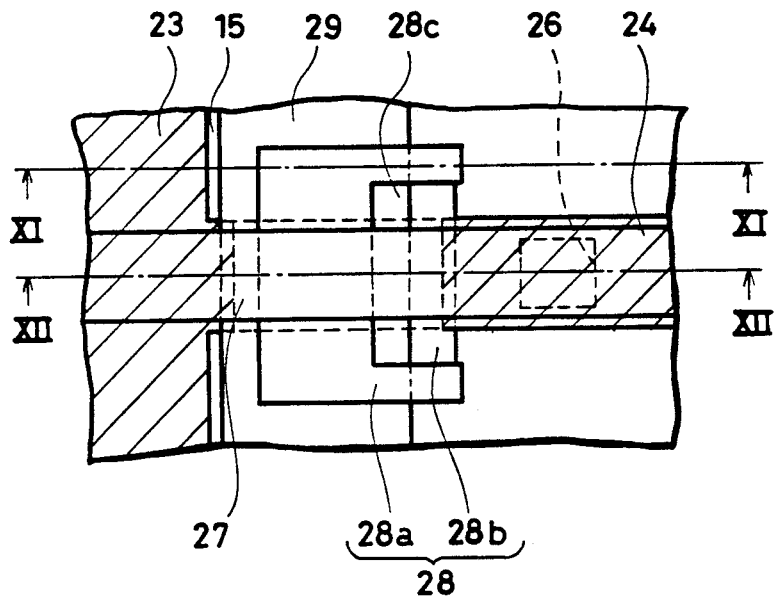
FIG. 10A is a partial plan view showing the configuration of one memory cell incorporated in the flash EEPROM of FIG. 9.
Figure 10B:
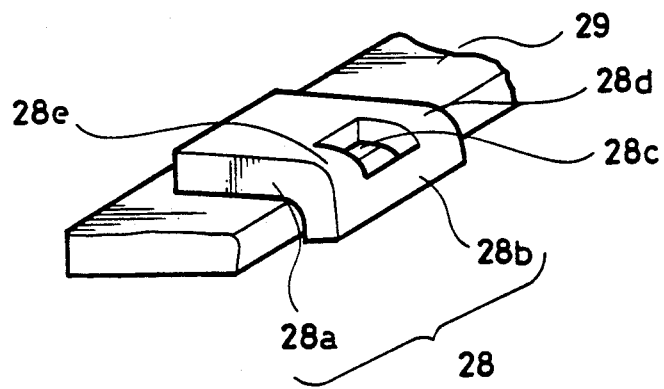
FIG. 10B is a perspective view in part showing control and floating gates of the memory cell shown in FIG. 10A.
Figure 10C:
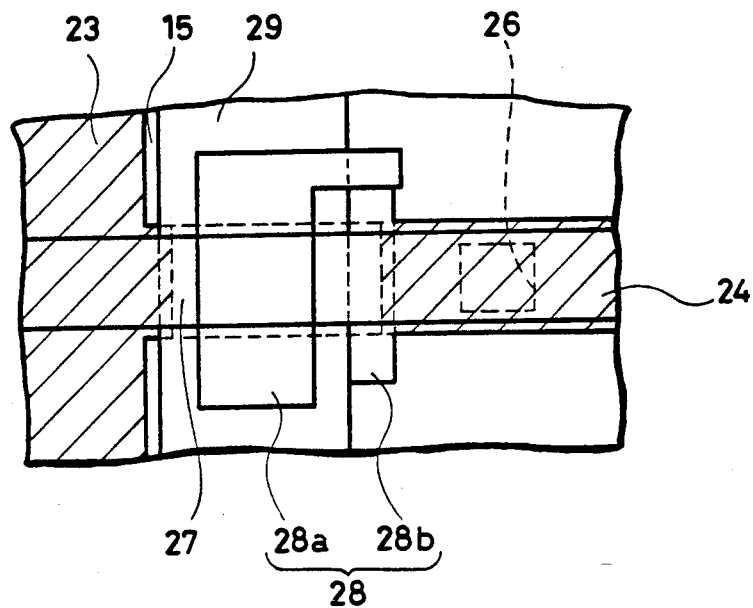
FIG. 10C is a partial plan view showing another configuration of one memory cell incorporated in the flash EEPROM.
Figure 10D:
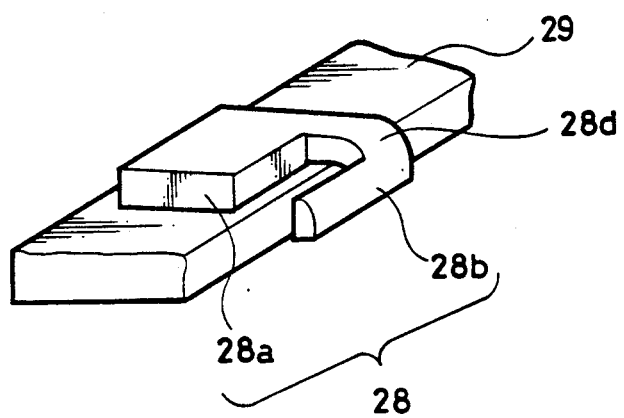
FIG. 10D is a perspective view in part showing control and floating gates of the memory cell shown in FIG. 10C.
Figure 10E:
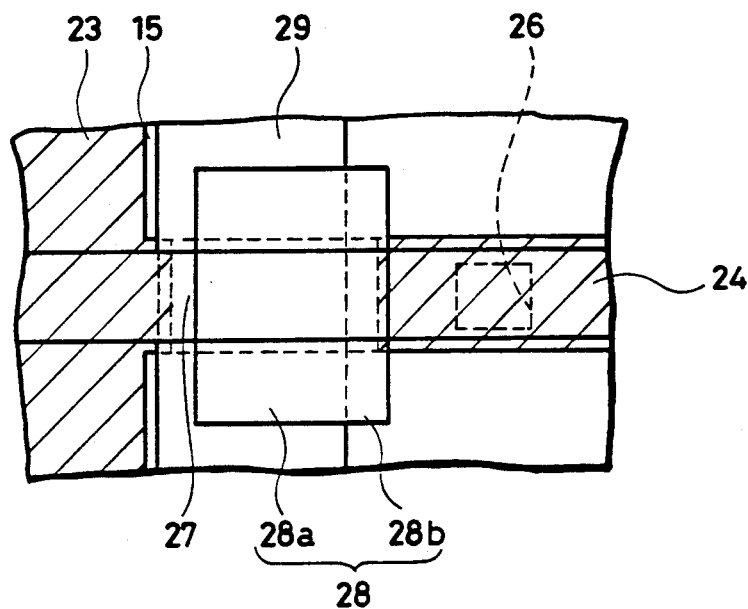
FIG. 10E is a partial plan view showing further another configuration of one memory cell incorporated in the flash EEPROM.
Figure 10F:
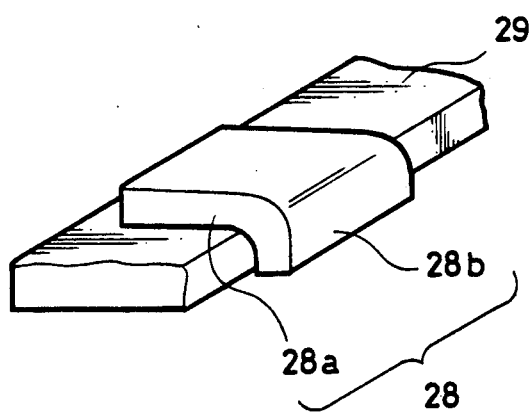
FIG. 10F is a perspective view in part showing control and floating gates of the memory cell shown in FIG. 10E.

As shown in FIG. 10A and 10B, the floating gate 28 has bifurcated structure with a window portion 28C and two small legs 28d, 28e. Thus, any misalignment of the mask for forming the first floating gate section 28a on the control gate 29 does not cause a displacement of not only the channel region created in the substrate below the second floating gate section 28b but also the overlapped area between the control gate 29 and the first floating gate section 28a as described later in the process of manufacturing the device. The floating gate 28 may have a structure with one small leg 28d as shown in FIGS. 10C and 10D. The structure shown in FIGS. 10E and 10F at least reduces the area of the semiconductor substrate occupied by the floating gate 28 with the second floating gate section 28b on one side of the control gate 29.

Figure 11:
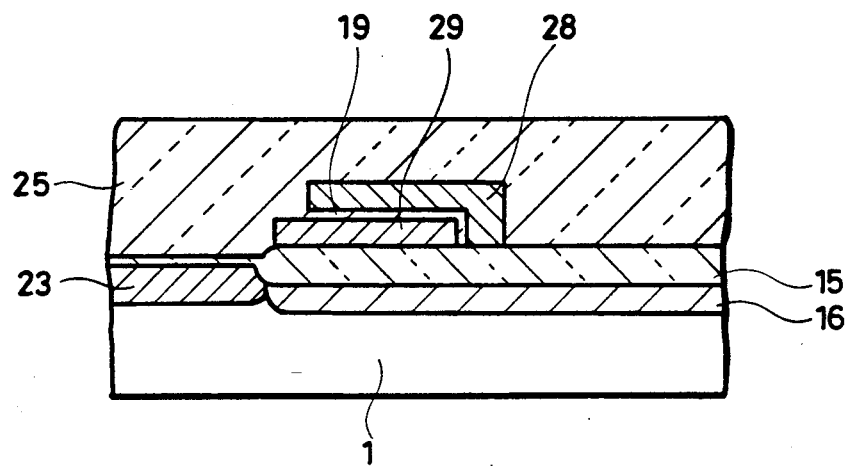
FIG. 11 is a cross-sectional view of the memory cell taken along the line XI—XI of FIG. 10A.
Figure 12:
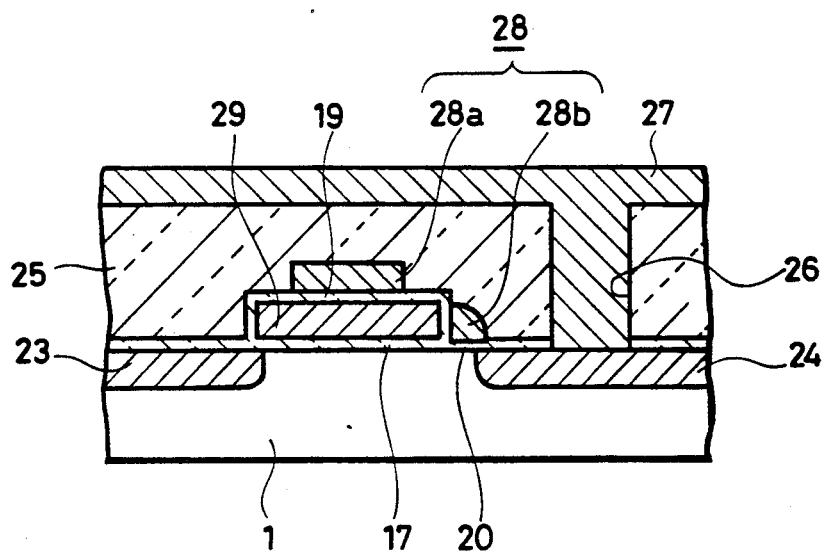
FIG. 12 is a cross-sectional view of the memory cell taken along the line XII—XII of FIG. 10A.

As shown in FIGS. 11 and 12, a thick insulating layer covers the floating gate 28 formed of the first and second floating gate sections 28a and 28b provided in the thick insulating layer 25 is a contact hole 26 which extends through the insulating layer 25 to the drain region 24. An electrical interconnection 27 which serves as a bit line is deposited over the thick insulating layer 25 and is coupled to the drain region 24 through the contact hole 26.

The floating gate sections 28a and 28b are electrically interconnected on the isolation field oxide layer 15 via a pair of extended portions stretching along the side edges of the floating gate section 28a perpendicular to the control gate 29.

The floating gate 28 and the control gate 29 are provided on the field oxide layer 15 for device isolation. There is formed in the semiconductor substrate below the field oxide layer 15 a channel stopper region 16 of p-type impurities for the prevention of current leakage.

Now, the operation of the flash EEPROM is described. In a data writing cycle of operation, a high-level data writing voltage $V_{CP}$ is applied to the control gate 29 at the same time as a high-level voltage $V_{DP}$ is applied to the drain region, while the source region 23 and the substrate 1 are kept at 0 V or ground potential. The application of the high-level voltages produces a large number of hot electrons having high electrical energy in the channel region near the drain region 24. Some of the hot electrons are avalanche-injected across the barrier of the second oxide layer 20 into the second floating gate section 28b, thereby storing negative charge in the floating gate 28. As a result, the control gate 28 assumes a state of high threshold voltage with respect to the control gate 29, and this state is defined as a logic "0" state. The potential $V_{FP}$ at which the floating gate 28 is kept is determined by the ratio between data writing voltage $V_{CP}$ and the coupling capacitor between the control gate and the floating gate. It should be pointed out that the coupling capacitance between the second floating gate section 28b of the floating gate 28 and the control gate 29 is negligibly small so that the coupling capacitance between the first floating gate section 28a and the control gate 29 practically represents the capacitance between the floating gate 28 and the control gate 29. Since the first floating gate section 28a can be designed and fabricated with accurate dimensions, it is possible to obtain a uniform coupling capacitance between the control gate and the floating gate, thus preventing undesired fluctuation in electrical characteristics of the memory device.

In order to erase the data stored in the floating gate 28, an erasure voltage $V_{DE}$ is applied to the drain region 24, while the control gate 29 and the substrate 1 are brought to 0 V or ground potential, leaving the source region 23 floating. Under this conditions, the data-representing negative charge in the floating gate 28 is removed from the second floating gate section 28b through the intervening second oxide layer 20 back to the drain region 24 under the Fowler Novdheim Tunneling effect. With the negative charge thus removed, the floating gate 28 assumes a state of low threshold voltage with respect to the control gate 29, and it is defined as a logic "1" state.

In reading the data out of the control gate 28, a readout voltage $V_{CR}$ is applied to the control gate 29 while the drain region 24 is supplied with a voltage $V_{DR}$ which is low enough not to produce hot electrons. Depending on whether a channel region is created below the portion of the second oxide layer 20 underlying the second floating gate section 28b, that is, depending on a difference of threshold voltage the binary state "1" or "0" is decided.

Voltage conditions of major components parts in the flash EEPROM are listed in the following table for write, erase and read modes of operation.

| MODE | ELEMENT | | | |
| --- | --- | --- | --- | --- |
| | CONTROL GATE | BIT LINE (DRAIN) | SOURCE | FLOATING GATE |
| WRITE | $V_{CP}$ | $V_{DP}$ | 0 V | $V_{FP}$ |
| ERASE | 0 V | $V_{DE}$ | Floating | $V_{FE}$ |
| READ | $V_{CR}$ | $V_{DR}$ | 0 V | $V_{FR}$ |

Figure 8A:
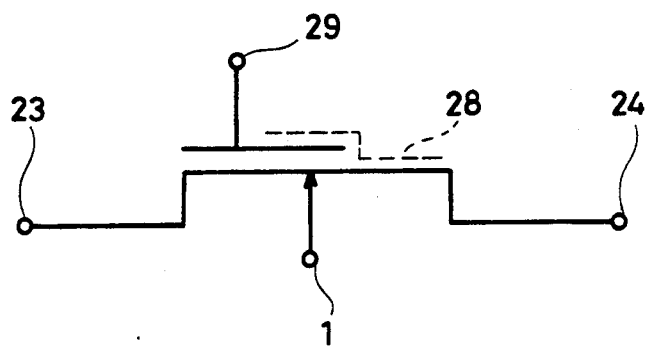
FIG. 8A is an equivalent circuit of one memory cell incorporated in a flash EEPROM according to one embodiment of the invention.
Figure 8B:
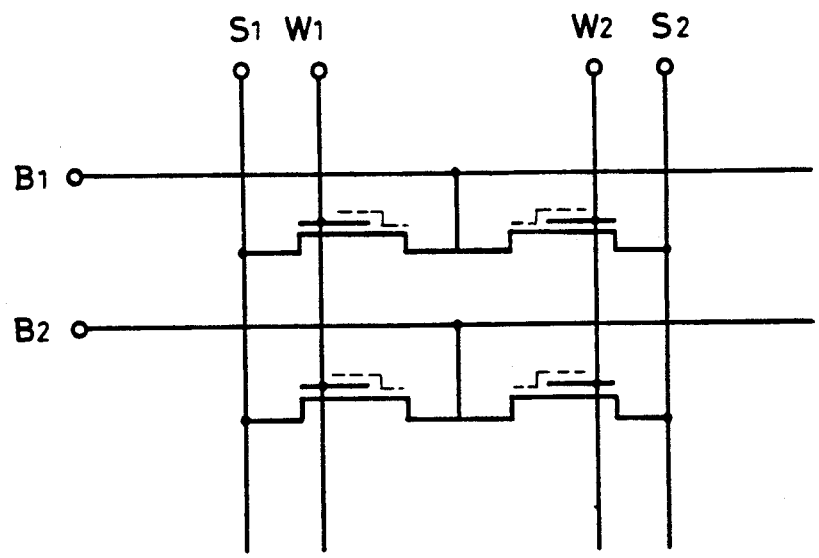
FIG. 8B is an equivalent circuit of a 4-bit memory configuration formed by using the memory cell of FIG. 8A.
Figure 9:
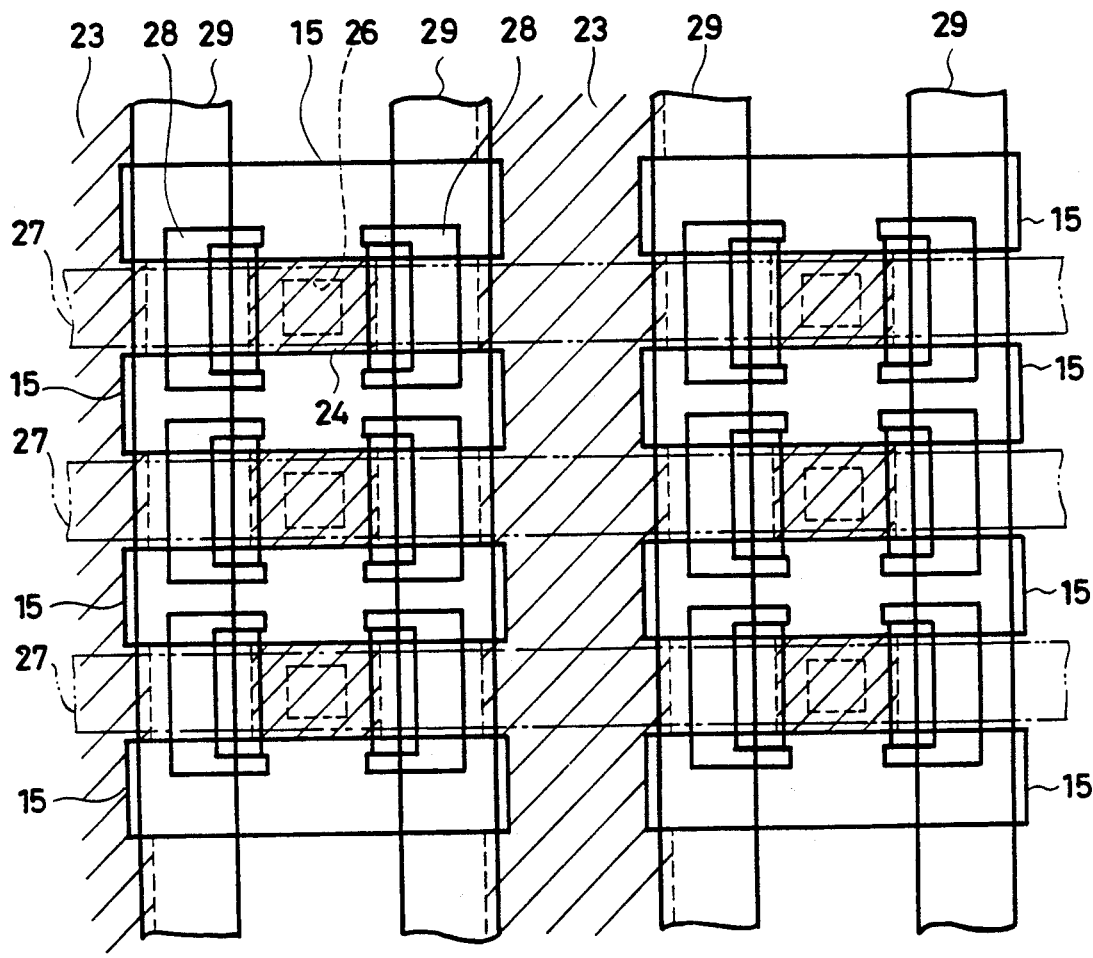
FIG. 9 is a plan view showing a planar configuration of a flash EEPROM embodying the invention.

Referring to FIGS. 8A and 8B, in data writing and reading modes of operation, specified bit lines B1 and B2, word lines W1 and W2 are activated by the application of voltage to initiate the desired operation. In the erasure mode, all the bit lines B1 and B2 are applied with an erasure voltage $V_{DE}$ to effect the data erasing operation on all the bit lines simultaneously.

The typical values for the high level voltage and the low level voltage to be applied during the above specified modes of operation are as follows.

Data writing mode:
Control gate voltage $V_{CP}=12.5$ V
Drain voltage $V_{DP}=10$ V
Data reading mode:
Control gate voltage $V_{CR}=5$ V
Drain voltage $V_{DR}=2$ V
Eraser mode:
Drain voltage $V_{DE}=12.5$ V Voltage values other than mentioned above may suitably be used. Although different values are cited for the control gate voltage and the drain voltage to be employed in the data writing cycle, the same voltage value may suitably be used.

In the foregoing embodiment, the flash EEPROM has been described as having the arrangement of an n-channel filed effect transistor where the n-type source region 23 and the n-type drain 24 are created in the p-type semiconductor substrate. However, the flash EEPROM may be of p-channel field effect transistor type.

Referring to FIGS. 13A-13G and FIGS. 14A-14G, a method for manufacturing the semiconductor memory device in accordance with this invention is described.

Figure 13A:
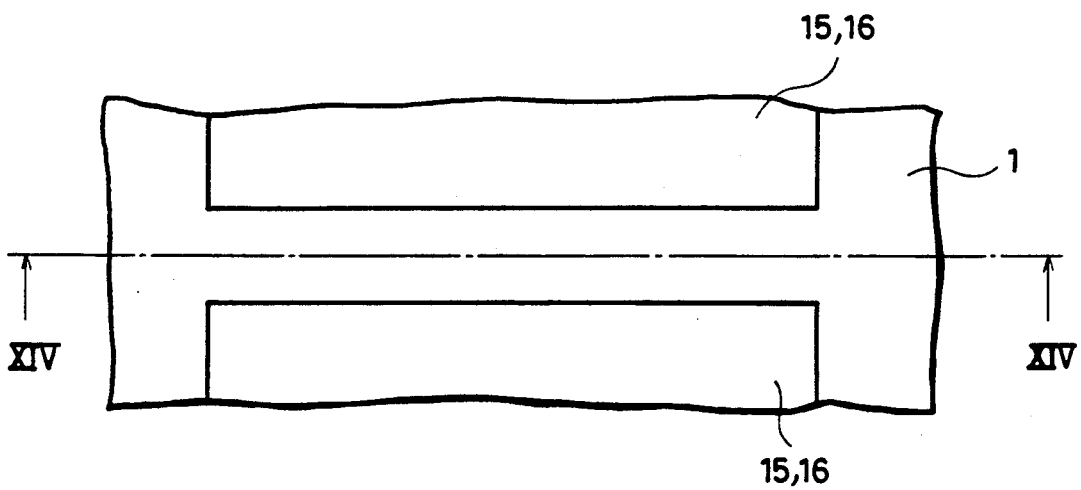
FIGS. 13A-13G are partial plan views of the memory cell shown in FIG. 10A at successive stages of manufacture thereof.
Figure 14A:
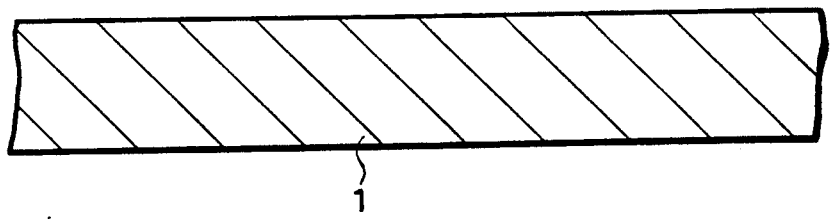
FIGS. 14A-14G are cross-sectional views taken along the line XIV—XIV of FIGS. 13A-13G, respectively, showing the memory cell in the flash EEPROM of FIG. 10A at successive stages of manufacture thereof.

As shown, a silicon oxide layer and silicon nitride layer are successively deposited to the desired thickness on a p-type semiconductor substrate 1 by, for example, thermal oxidation or chemical vapor deposition thereby to form a double-layered mask. The double-layered mask is then selectively etched to a desired pattern. Using this patterned double-layered mask, p-type impurities are introduced into the semiconductor substrate 1 by ion implantation to form impurity regions. The semiconductor substrate 1 is treated at a temperature of 1,000° C. in an oxygen ambience to selectively oxidize the substrate. As a result of this treatment, exposed surface areas of the semiconductor substrate 1 as well as the areas directly below the edges of the mask are oxidized to form a thick field oxide layer 15 of silicon oxide. The thermal treatment at the same time causes the impurity regions to be diffused into impurity diffusion regions thereby to form a channel stopper region 16 under the field oxide layer 15. As shown in FIGS. 13A and 14A, the double-layer mask is then removed by etching to leave the surface area of the substrate 1 between adjacent field oxide layer 15 exposed.

Figure 13B:
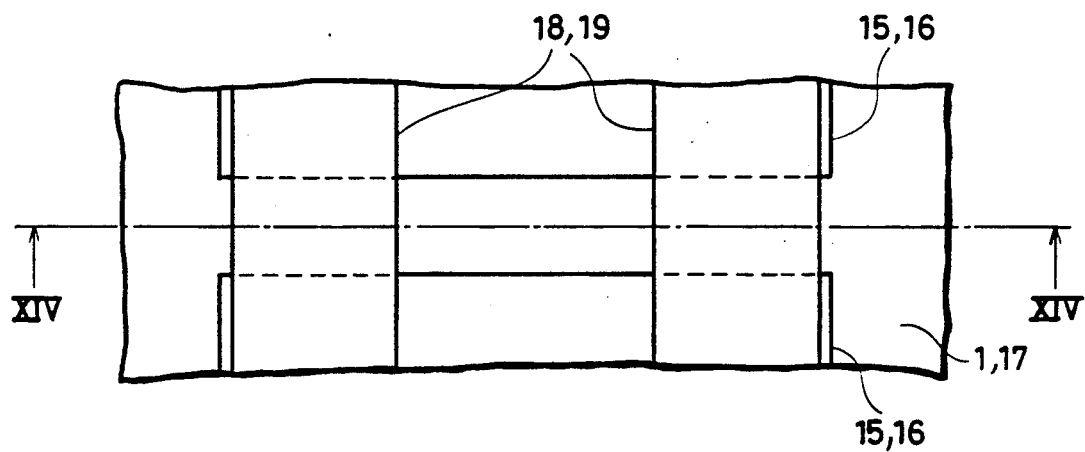
Figure 14B:
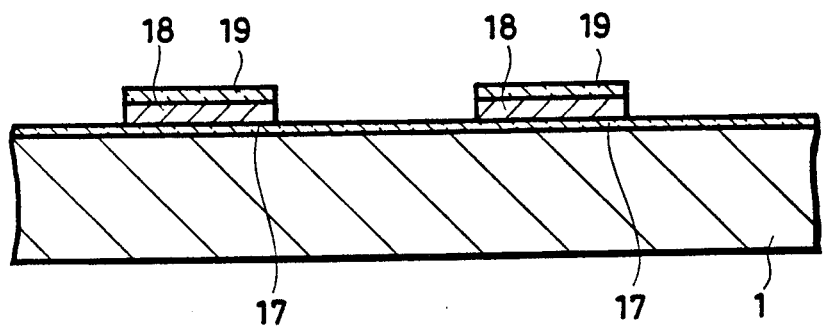

Referring to FIGS. 13B and 14B, the semiconductor substrate 1 is subjected to a thermal oxidation to form a first thin gate oxide layer 17 of silicon oxide over the exposed surface area. Then, a first polysilicon layer 18 doped with n-type impurities is deposited to a desired thickness over the entire surface of the substrate by means of CVD technique and this polysilicon layers serves as the control gate electrode. A thin insulating layer 19 of silicon oxide or silicon nitride is coated over the entire surface of the first polysilicon layer 18 by CVD technique and this thin insulation layer also serves as the etching mask for the underlying layer. The thin insulating layer 19 is coated with a positive resist which is patterned. Using the patterned resist (not shown) as the mask, the thin insulating layer 19 and the first polysilicon layer 18 are successively and selectively etched by means of anisotropic etching such as reactive ion etching (hereinafter referred to as RIE). Thereafter the patterned resist is removed by ashing technique to leave portions of the first polysilicon layer 18 and the thin insulating layer 19 on the first gate oxide layer 17 between the field oxide layers 15.

Figure 13C:
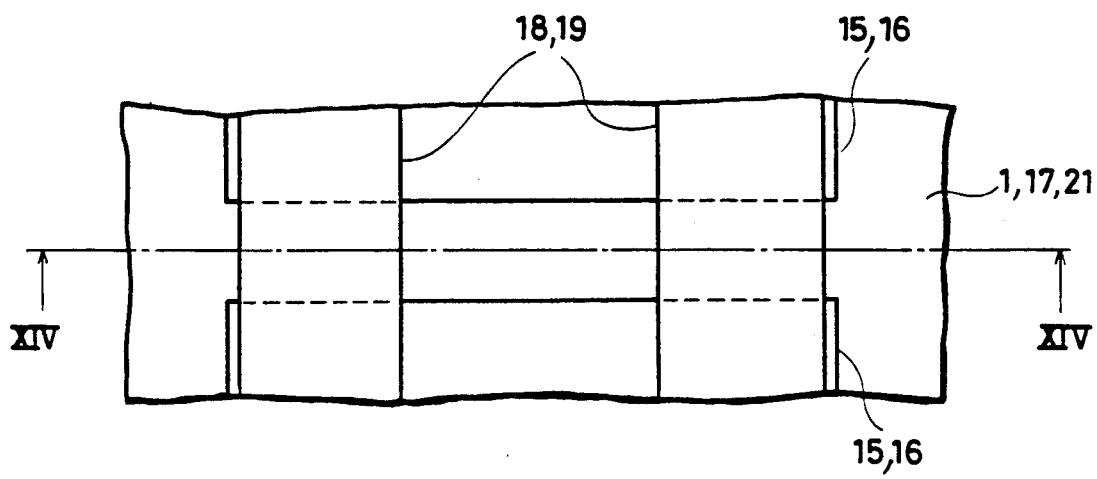
Figure 14C:
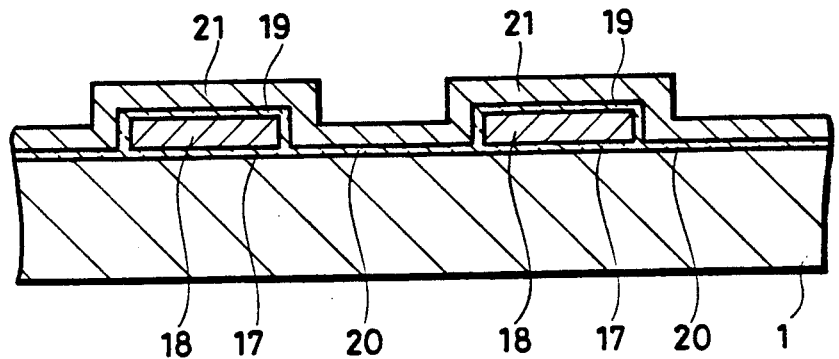

A further anisotropic etching by the RIE technique selectively removes the exposed first gate oxide layer 17. The entire surface of the substrate 1 is then coated with a second gate oxide layer 20 of silicon oxide using CVD technique thereby to cover the thin insulating layer 19 and the first polysilicon layer 18. A second polysilicon layer 21 doped with n-type impurities is deposited to a desired thickness on the entire surface of the second gate oxide layer 20 as shown in FIGS. 13C and 14C, and this second polysilicon layer is formed into a floating gate.

Figure 13D:
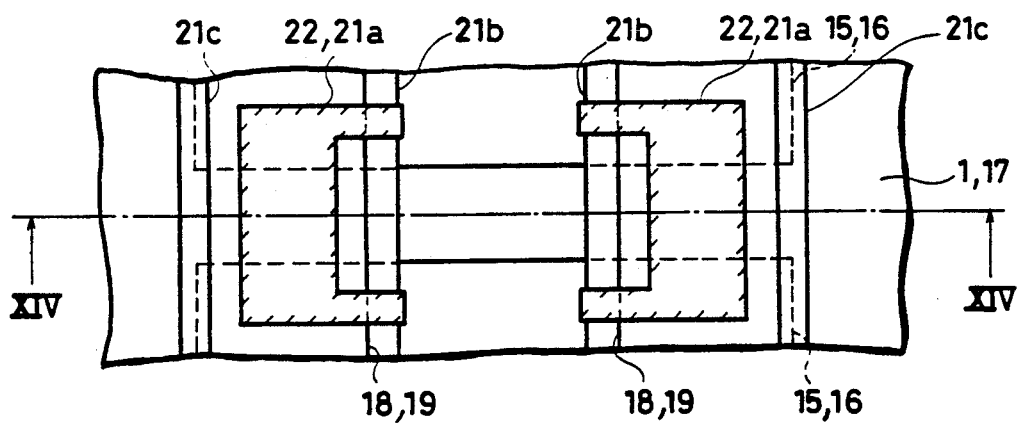
Figure 14D:
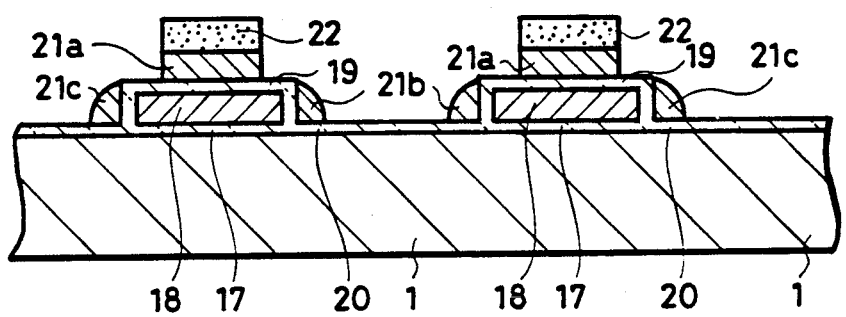

Referring to FIGS. 13D and 14D, another positive resist is coated over the second polysilicon layer 21 and is patterned to form a desired resist pattern 22. The patterned resist 22 has a pattern layout to define on the first polysilicon layer 18 the first floating gate section 21a and a pair of connection extensions for electrically connecting the first floating gate section 21a to the second floating gate section 21b yet to be formed. In FIG. 14D, only the portion of the patterned resist 22 for defining the first floating gate section 21a is illustrated. The position of the connection extensions relative to the first floating gate section 21a and their configuration are not necessary limited to those shown in FIG. 13D. Accordingly, any other arrangement of the connection extensions may suitably be used. Subsequently, the second polysilicon layer 21 is etched away at areas not covered by the patterned resist 22 using anisotropic etching technique such as RIE.

The anisotropic etching leaves portions 21a of the second polysilicon layer 21 unremoved under the patterned resist 22. It also leaves other portions 21b and 21c of the second polysilicon layer 21 unremoved on the opposite sides of the first polysilicon layer 18 upon the second gate oxide layer 20. The upper portion 21a left on the first polysilicon layer 18 is shown in FIG. 14D together with the side portions 21b and 21c left on the opposite sides of the first polysilicon layer 18. It is noted that the connection extensions for electrically connecting the upper layer portion 21a and the side layer portion 21b lie between the resist pattern 22 and the side layer portion 21b. The dimensional size is of the side layers 21b and 21c may be controlled by varying the thickness of the second polysilicon layer 21 and etching quantities.

Figure 13E:
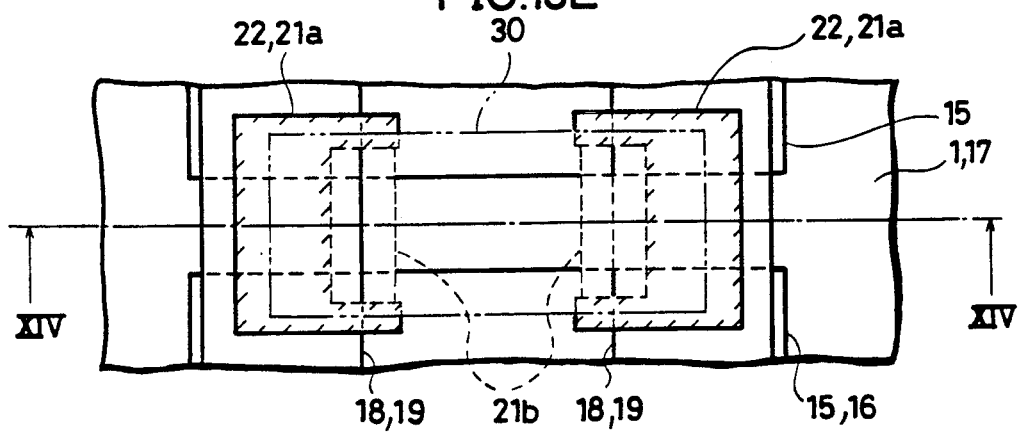
Figure 14E:
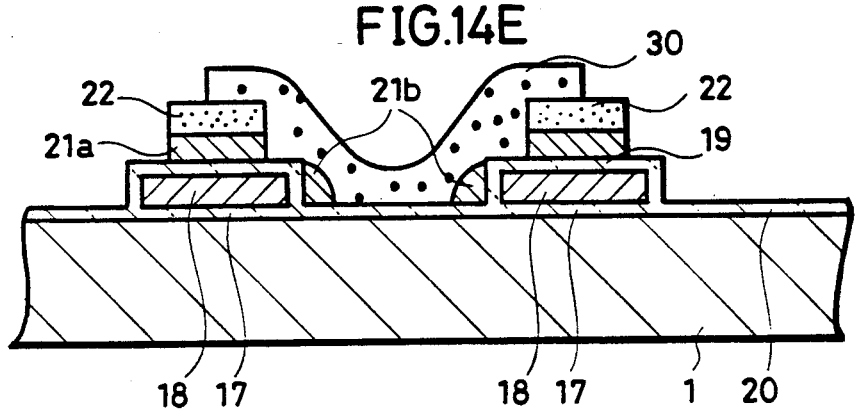

In the next step shown in FIGS. 13E and 14E, another positive resist is applied over the entire surface of the substrate 1 to cover the first patterned resist 22. The coated resist is then patterned into a second resist pattern 30 for covering the upper layer 21a and the side layer 21b. The second patterned resist 30 is indicated by a two-dotted dashed line in FIG. 13E. A subsequent isotropic etching selectively removes the one side layer 21c not protected by the second resist pattern 30.

Figure 13F:
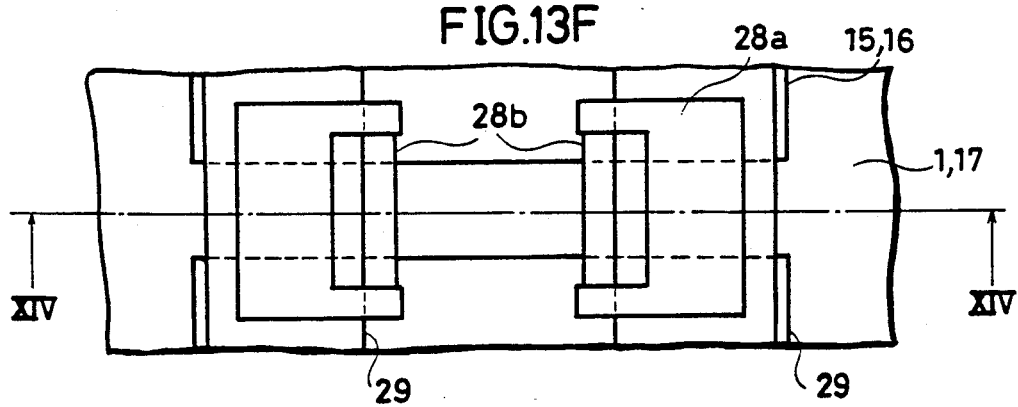
Figure 14F:
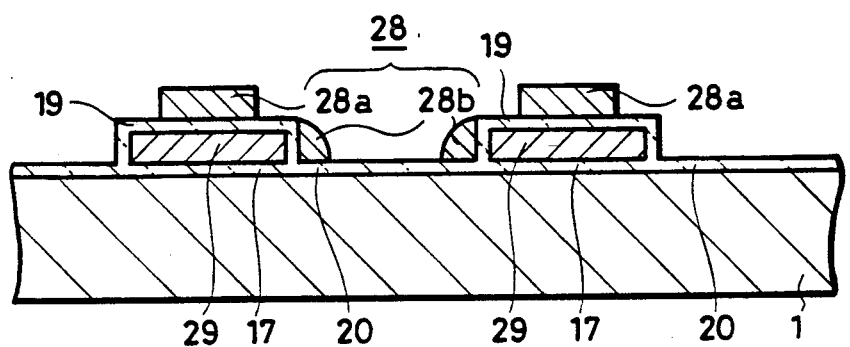

As shown in FIGS. 13F and 14F, the first and second resist patterns 22 and 30 are supplied away by ashing technique to expose the upper layer 21a, the side layer 21b as well as the connection extensions between them. At this point, the upper layer 21a forms and serves as the first floating gate section 28a, and the side layer 21b as the second floating gate section 28b. The first floating gate section 28a and the second floating section 28b which are electrically interconnected comprise the floating gate 28. The first polysilicon layer 18 comprises a control gate 29 which also serves as the word line. It is required only to form and arrange the first floating gate section 28a on the control gate 29 so that they provide a desired coupling capacitance between them. No precise positional alignment between the first floating gate section 28a and the control gate 29 is necessary.

Using the control gate 29 and the floating gate 28 as the masks, n-type impurity ions are implanted into the substrate 1 to self-align impurity regions on the opposite sides of the control gate 29. Thereafter, the substrate 1 is subjected to heat treatment to diffuse the impurity ions out of the impurity region into the desired junction depth, creating a source region 23 and a drain region 24. In this manner, the drain region 24 is provided adjacent the second floating gate section 28b, while the source region 23 adjacent to the control gate 29. The source region 23 partially overlaps the control gate 29 via the first gate oxide layers 17, and the drain region 24 partially overlaps the second floating gate section 28b via the second gate oxide layer 20. A thick insulating silicon oxide layer 25 is coated over the entire surface of the substrate 1 by CVD to cover the floating gate 28. A contact hole 26 is then made in the insulating layer 25 that extends to a drain region 24 by means of selective etching technique. An aluminum interconnection layer is deposited on the entire surface of the thick insulating layer 25 and into the contact hole 26 to a desired thickness by sputtering. The patterning of the aluminum layer provides a conductive interconnection 27 which also serves as the bit line. The aluminum interconnection 27 is communicated with the drain region 24 through the contact hole 26.

Figure 13G:
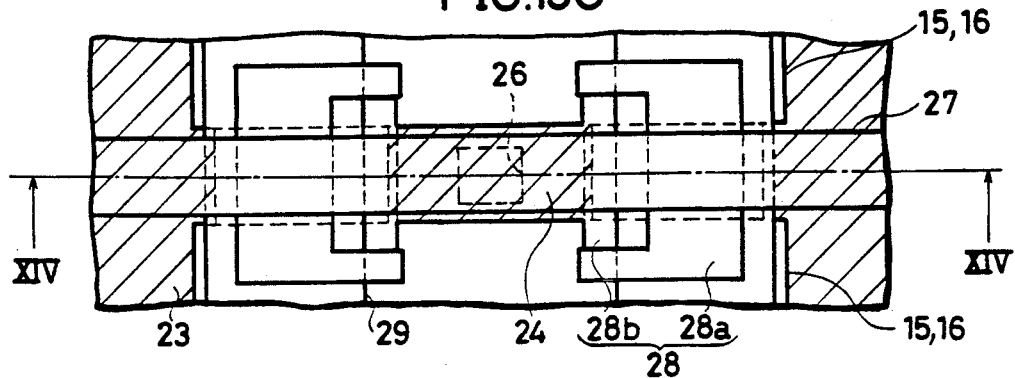
Figure 14G:
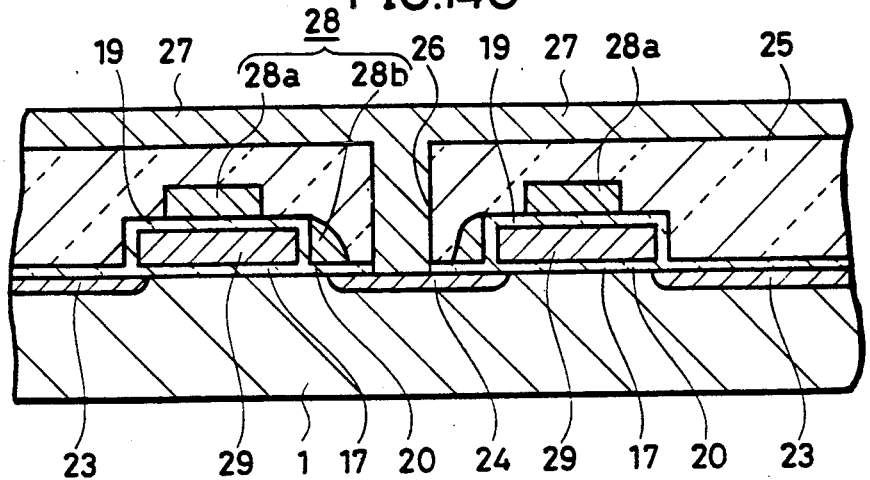

This finishes a memory cell for the flash EEPROM as shown in FIGS. 13G and 14G.

In the illustrated embodiment, the floating gate 28 and the control gate 29 have been described as being formed of the polysilicon layers 18 and 21 doped with n-type impurities. However, the invention is not limited thereto. Other suitable electrically conductive materials may be used to advantage.

As is obvious from the foregoing detailed description, the novel arrangement of the memory cell where a tiny second floating gate is formed on the side of the control gate disposed on the substrate substantially reduces the memory cell area and provides for a further miniaturization of the semiconductor memory device. The first floating gate should only be positioned on the control gate so that a desired capacitance is produced between them. Adverse effects due to the misalignment between the first floating gate and the control gate are effectively avoided. This assures the uniform capacitance between the first floating gate and the control gate through all the memory cells in the manufactured semiconductor memory device. Also, the length of the channel region formed under the second floating gate is uniform throughout the memory cells. All these are effective to provide semiconductor memory devices having desired electrical characteristics and uniform characteristics among memory cells.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. In a semiconductor memory device having a semiconductor substrate of a first conductivity type with a major surface and a plurality of memory cells formed spaced apart and separated from one another by an isolation layer formed on said major surface, each of said memory cells comprising:

first and second impurity regions of a second conductivity type formed spaced apart along a channel direction at the major surface of said semiconductor substrate to define a channel region;

a first conductive layer, part of a word line having a length extending in a direction perpendicular to the channel direction, formed on said channel region with a first insulating layer placed therebetween, said first conductive layer having first and second parallel sides extending in a direction perpendicular to said channel direction; and a second conductive layer formed on said first conductive layer and a second insulating layer positioned therebetween for storing charge in said second conductive layer in response to the voltage applied to said first conductive layer, said second conductive layer comprising an upper conductive layer portion formed on said first conductive layer and said second insulating layer positioned therebetween, said upper conductive layer portion extending away from said first side of said first conductive layer in the channel region direction to a remote side substantially parallel to said second side of said first conductive layer; and a side conductive layer portion formed (i) at said first side of said first conductive layer with a third insulating layer disposed therebetween and (ii) on said channel region adjacent said first impurity region and on said first insulating layer, said upper conductive layer portion and said side conductive layer portion being electrically connected to each other, a portion of said first insulating layer disposed between said side conductive layer and said channel region having a thickness sufficient to allow tunneling current to pass therethrough, said plurality of memory cells sharing said first conductive layer and said second impurity region, and said upper conductive layer of said second conductive layer being contained entirely within an area of the first conductive layer in a plane parallel to the major surface of said substrate, said remote side of said upper conductive layer spaced, in the channel direction, from said second side of said first conductive layer.

2. A semiconductor memory device according to claim 1 wherein said upper conductive layer portion and said side conductive layer portion are electrically connected to each other on said isolation layer.

3. A semiconductor memory device according to claim 1 wherein the length of said upper conductive layer portion in the channel direction is greater than the length of the side conductive layer portion in said channel direction.

4. A programmable non-volatile semiconductor memory device, comprising:
   a semiconductor substrate of a first conductivity type and having a major surface;
   source and drain impurity regions of a second conductivity type formed spaced apart from each other in a channel direction at the major surface of said semiconductor substrate to form a channel region;
   a control gate electrode, part of a word line having a length extending in a direction perpendicular to the channel direction, formed on said channel region through a first insulating layer and having first and second parallel sides extending in a direction perpendicular to said channel direction;
   a floating gate electrode including an upper conductive layer portion formed on said control gate electrode through a second insulating layer and a side conductive layer portion formed adjacent said first side of said control gate electrode and separated therefrom by a third insulating layer and formed on said channel region in overlapping relationship with said drain impurity region through a fourth insulating layer;
   said upper and side conductive portions being electrically interconnected adjacent said first side of said control gate;
   said upper conductive layer portion of said floating gate extending away from said first side of said control gate in the channel direction to a remote side substantially parallel to, and not as far in the channel direction as, said second side of said control gate.

5. A programmable non-volatile semiconductor memory device according to claim 4, wherein the thickness of said fourth insulating layer between said side conductive layer and said channel region is sufficient to allow tunnelling current to flow therethrough, whereby said device is electrically erasable.

6. A programmable non-volatile semiconductor memory device according to claim 4, wherein the length in the channel region of said side conductive layer portion of said floating gate electrode is shorter than the length of said upper conductive layer portion.

7. A programmable non-volatile semiconductor memory device according to claim 6, wherein said side conductive portion of said floating gate electrode is bifurcated.

8. A programmable non-volatile semiconductor memory device according to claim 4 wherein the length of the upper conductive layer portion in the channel direction is greater than a length of the side conductive layer portion in said channel direction.

9. A programmable, non-volatile memory semiconductor device, comprising:
   a semiconductor substrate of a first conductivity type and having a major surface;
   source and drain impurity regions of a second conductivity type formed spaced apart from each other in the major surface of said semiconductor in a channel direction to form a channel having first and second regions;
   a control gate electrode, part of a word line having a length extending in a direction perpendicular to the channel direction, formed on said first region of said channel through a first insulating layer, said control gate having first and second parallel sides extending in a direction perpendicular to said channel direction;
   a floating gate electrode having a first side conductive layer portion and an upper conductive layer portion;
   said side conductive layer portion formed adjacent said first side of said control gate electrode on said second region of said channel and overlapping said drain region, with a second insulating layer positioned therebetween;
   said upper conductive layer portion formed on said control gate electrode through a third insulating layer and connected to said side conductive layer portion;
   said upper conductive layer portion of said floating gate extending away from said first side of said control gate in the channel direction to a remote side substantially parallel to and non-coincident with said second side of said control gate, said upper conductive layer portion being contained entirely within an area of the control gate in a plane parallel to the major surface of said substrate.

10. A programmable, non-volatile memory semiconductor device according to claim 9 wherein the length of said upper conductive layer portion in the channel direction is greater than the length of the side conductive layer portion in said channel direction.

11. A semiconductor memory device comprising:
    a semiconductor substrate of a first conductivity type having a major surface;
    memory cells in a number of (m×n) arranged in the matrix of m rows and n columns and separated from one another by an isolation layer formed on the major surface of said semiconductor substrate;
    m number of word lines associated with the memory cells in each row;
    n number of bit lines associated with the memory cells in each column;
    m number of source lines associated with said memory cells in each row,
    each of said memory cells comprising:

first and second impurity regions of a second conductivity type formed spaced apart along a channel direction in said major surface of said semiconductor substrate to define a channel region, said first impurity region being connected to said bit lines and said second impurity region being connected to said source lines;

a first conductive layer forming a portion of a respective word line having a length extending in a direction perpendicular to the channel direction and formed on said channel region with a first insulating layer disposed therebetween, said first conductive layer having first and second parallel sides extending in a direction perpendicular to said channel direction, said word line extending in a direction perpendicular to said channel direction; and a second conductive layer formed on said first conductive layer and a second insulating layer therebetween for storing charge in said second conductive layer in response to the voltage applied to said first conductive layer, said second conductive layer comprising:

an upper conductive layer portion formed on said first conductive layer and said second insulating layer positioned therebetween, said upper conductive layer portion extending away from said first side of said first conductive layer in the channel direction to a remote side substantially parallel to said second side of said first conductive layer; and a side conductive layer portion formed (i) at said first side of said first conductive layer with a third insulating layer disposed therebetween and (ii) on said channel region in overlapping relationship with said first impurity region and on said first insulating layer, said upper conductive layer portion and said side conductive layer portion being electrically connected to each other, a portion of said first insulating layer disposed between said side conductive layer portion and said channel region having a thickness sufficient to allow tunneling current to pass therethrough, and said upper conductive layer portion of said second conductive layer being contained entirely within an area of the first conductive layer in a plane parallel to the major surface of said substrate, said remote side of said upper conductive layer portion spaced in the channel direction from said second side of said first conductive layer.

12. A semiconductor memory device according to claim 11 wherein said word lines arranged parallel to said source lines and said bit lines arranged perpendicular to said word lines.

13. A semiconductor memory device according to claim 11 wherein the length of the upper conductive layer portion in the channel direction is greater than the length of the side conductive layer portion in said channel direction.

* * * * *